United States Patent
Umehara et al.

(10) Patent No.: US 12,282,077 B2
(45) Date of Patent: Apr. 22, 2025

(54) SENSOR

(71) Applicant: TDK CORPORATION, Tokyo (JP)

(72) Inventors: Hiromichi Umehara, Tokyo (JP); Keisuke Takasugi, Tokyo (JP); Takehiro Isoda, Tokyo (JP); Kenji Inage, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 18/737,185

(22) Filed: Jun. 7, 2024

(65) Prior Publication Data

US 2024/0319292 A1    Sep. 26, 2024

Related U.S. Application Data

(63) Continuation of application No. 17/945,485, filed on Sep. 15, 2022, now Pat. No. 12,044,753.

(60) Provisional application No. 63/246,437, filed on Sep. 21, 2021.

(30) Foreign Application Priority Data

Sep. 1, 2022  (JP) .................................. 2022-139158

(51) Int. Cl.
*G01R 33/09*   (2006.01)
*G01R 33/00*   (2006.01)
*G01R 33/02*   (2006.01)

(52) U.S. Cl.
CPC ....... *G01R 33/093* (2013.01); *G01R 33/0005* (2013.01); *G01R 33/0206* (2013.01)

(58) Field of Classification Search
CPC .............. G01R 33/093; G01R 33/0005; G01R 33/0206; G01R 33/0017; G01R 33/0052; G01R 33/098

See application file for complete search history.

(56) References Cited

U.S. PATENT DOCUMENTS

| | | | |
|---|---|---|---|
| 8,018,229 B1* | 9/2011 | Horning | G01R 33/0206 324/252 |
| 2004/0150809 A1 | 8/2004 | Chang et al. | |
| 2006/0176142 A1 | 8/2006 | Naito et al. | |
| 2009/0015251 A1 | 1/2009 | Azumi et al. | |
| 2012/0272514 A1* | 11/2012 | Naito | B82Y 25/00 29/602.1 |
| 2013/0134970 A1* | 5/2013 | Schuhl | G01R 33/098 427/127 |
| 2015/0285873 A1 | 10/2015 | Cai et al. | |
| 2016/0109534 A1* | 4/2016 | Dieny | G01R 35/005 324/252 |
| 2018/0275219 A1* | 9/2018 | Umetsu | G01R 33/093 |

* cited by examiner

*Primary Examiner* — Alvaro E Fortich
(74) *Attorney, Agent, or Firm* — Oliff PLC

(57) ABSTRACT

A magnetic sensor includes an insulating layer including a flat portion and a protruding portion, a first MR element, and a second MR element. The protruding portion includes a first inclined surface and a second inclined surface. The first MR element is disposed on the first inclined surface. The second MR element is disposed on the second inclined surface. The protruding portion extends in a first direction parallel to a top surface of a substrate, and includes a plurality of recess portions each recessed in a direction parallel to the top surface of the substrate at an end of the protruding portion in the first direction.

15 Claims, 13 Drawing Sheets

SENSOR

CROSS REFERENCE TO RELATED APPLICATIONS

This application is a continuation of U.S. application Ser. No. 17/945,485, filed on Sep. 15, 2022, which claims the benefit of U.S. Provisional Patent Application No. 63/246,437 filed on Sep. 21, 2021 and Japanese Priority Patent Application No. 2022-139158 filed on Sep. 1, 2022, the entire contents of each of which are incorporated herein by their reference.

BACKGROUND

The technology relates to a sensor including sensor elements each disposed on an inclined surface.

Magnetic sensors using magnetoresistive elements have been used for various applications in recent years. A system including a magnetic sensor may be intended to detect a magnetic field containing a component in a direction perpendicular to the surface of a substrate by using a magnetoresistive element provided on the substrate. In such a case, the magnetic field containing the component in the direction perpendicular to the surface of the substrate can be detected by providing a soft magnetic body for converting a magnetic field in the direction perpendicular to the surface of the substrate into a magnetic field in the direction parallel to the surface of the substrate or locating the magnetoresistive element on an inclined surface formed on the substrate.

US 2006/0176142 A1 discloses a magnetic sensor in which an X-axis sensor, a Y-axis sensor, and a Z-axis sensor are provided on a substrate. Magnetoresistive elements forming the Z-axis sensor are provided on inclined surfaces of protruding portions formed on a base film of the substrate. The protruding portions are formed by dry-etching a thick film of silicon oxide. The magnetoresistive elements are formed by etching a multi-layer metal thin film formed on inclined surfaces of groove portions using photolithography.

In a magnetic sensor using magnetoresistive elements that are inclined with respect to the surface of a substrate like the magnetic sensor disclosed in US 2006/0176142 A1, it is preferable to form more magnetoresistive elements on inclined surfaces to enhance the sensitivity of the magnetic sensor. Each inclined surface has a shape that is longer in one direction than in the other direction as seen from above. The magnetoresistive elements are also formed near end portions of the inclined surfaces. However, there may be a case where photoresist for forming a photoresist mask to be used for etching flows out to regions near the end portions of the inclined surfaces, with the result that metal films for electrodes and the like or magnetoresistive elements cannot be formed with high accuracy.

The foregoing problem is true of not only magnetic sensors but also sensors in general that are obtained by forming sensor elements on inclined surfaces.

SUMMARY

A sensor according to one embodiment of the technology is a sensor configured to detect a predetermined physical quantity. The sensor according to one embodiment of the technology includes a substrate including a top surface, a support member disposed on the substrate, and a sensor element configured to change in a physical property depending on a predetermined physical quantity. The support member includes a flat portion including a flat surface parallel to the top surface of the substrate, and at least one protruding portion shaped to protrude from the flat surface. The at least one protruding portion includes an inclined surface inclined with respect to the top surface of the substrate. The sensor element includes a functional layer constituting at least a part of the sensor element. The functional layer is disposed on the inclined surface. The at least one protruding portion extends in a first direction parallel to the top surface of the substrate, and includes a plurality of recess portions each recessed in a direction parallel to the top surface of the substrate at an end of the at least one protruding portion in the first direction.

In the sensor according to one embodiment of the technology, the at least one protruding portion includes the plurality of recess portions. Thereby, according to one embodiment of the technology, the accuracy of the shape of the sensor element formed on the inclined surface can be increased.

Other and further objects, features and advantages of the technology will appear more fully from the following description.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
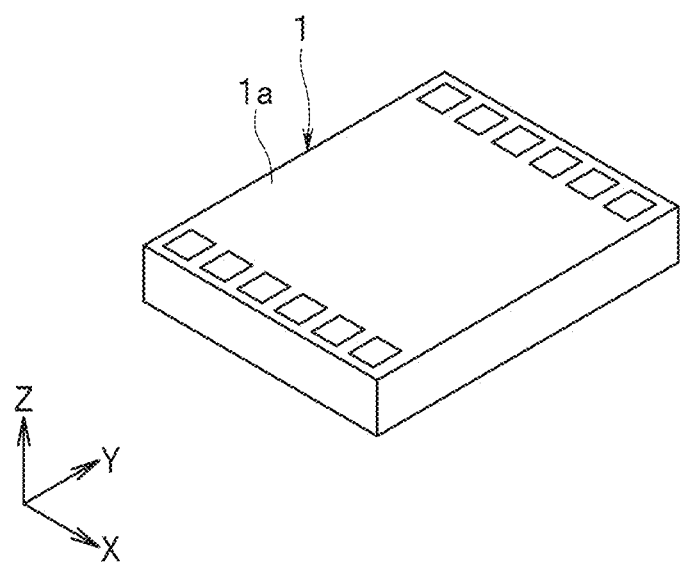
FIG. 1 is a perspective view showing a magnetic sensor according to a first example embodiment of the technology.

An object of the technology is to provide a sensor in which the accuracy of the shape of a sensor element formed on an inclined surface can be increased.

In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. Note that the description is given in the following order.

An example embodiment of the technology described below relates to a sensor configured to detect a predetermined physical quantity. In the example embodiment, the sensor includes sensor elements each configured to change a physical property depending on a predetermined physical quantity. For example, the predetermined physical quantity may be at least one of the direction or strength of a target magnetic field that is a magnetic field to be detected. In such a case, the sensor elements may be magnetic detection elements each configured to detect a change in at least one of the direction or strength of the target magnetic field. The sensor including magnetic detection elements is also referred to as a magnetic sensor. The magnetic sensor is configured to detect at least one of the direction or strength of the target magnetic field. Hereinafter, an example embodiment will be described in detail by taking a case where the sensor is a magnetic sensor as an example.

First Example Embodiment

Figure 2:
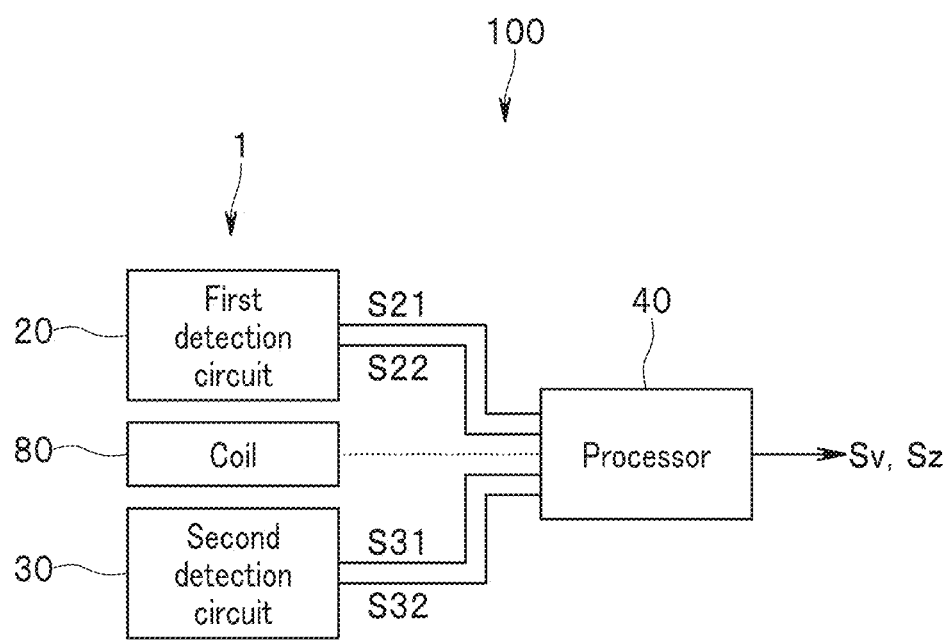
FIG. 2 is a functional block diagram showing a configuration of a magnetic sensor device including the magnetic sensor according to the first example embodiment of the technology.

First, a configuration of a magnetic sensor according to a first example embodiment of the technology will be described with reference to FIGS. 1 and 2. FIG. 1 is a perspective view showing a magnetic sensor according to the example embodiment. FIG. 2 is a functional block diagram showing a configuration of a magnetic sensor device including the magnetic sensor according to the example embodiment. The magnetic sensor 1 according to the example embodiment corresponds to the "sensor" of the technology.

As shown in FIG. 1, the magnetic sensor 1 is in the form of a chip with a rectangular parallelepiped shape. The magnetic sensor 1 includes a top surface 1a and a bottom surface located opposite to each other and also includes four side surfaces each connecting the top surface 1a to the bottom surface. The magnetic sensor 1 also includes a plurality of electrode pads disposed on the top surface 1a.

Now, a description will be given of a reference coordinate system in the present example embodiment with reference to FIG. 1. The reference coordinate system is an orthogonal coordinate system that is set with reference to a magnetic sensor 1 and defined by three axes. An X direction, a Y direction, and a Z direction are defined in the reference coordinate system. The X, Y, and Z directions are orthogonal to each other. In particular, in the example embodiment, a direction that is perpendicular to the top surface 1a of the magnetic sensor 1 and is oriented from the bottom surface to the top surface 1a of the magnetic sensor 1 is defined as the Z direction. The opposite directions to the X, Y, and Z directions will be expressed as −X, −Y, and −Z directions, respectively. The three axes defining the reference coordinate system are an axis parallel to the X direction, an axis parallel to the Y direction, and an axis parallel to the Z direction.

Hereinafter, the term "above" refers to positions located forward of a reference position in the Z direction, and "below" refers to positions opposite from the "above" positions with respect to the reference position. For each component of the magnetic sensor 1, the term "top surface" refers to a surface of the component located at the end thereof in the Z direction, and "bottom surface" refers to a surface of the component located at the end thereof in the −Z direction. The phrase "when seen in the Z direction" means that object is seen from a position away from the object in the Z direction.

As shown in FIG. 2, the magnetic sensor 1 includes a first detection circuit 20 and a second detection circuit 30. Each of the first and second detection circuits 20 and 30 includes a plurality of magnetic detection elements, and is configured to detect a target magnetic field to generate at least one detection signal. In particular, in the example embodiment, the plurality of magnetic detection elements are a plurality of magnetoresistive elements. The magnetoresistive elements will hereinafter be referred to as MR elements.

A plurality of detection signals generated by the first and second detection circuits 20 and 30 are processed by a processor 40. The magnetic sensor 1 and the processor 40 constitute a magnetic sensor device 100. The processor 40 is configured to, by processing the plurality of detection signals generated by the first and second detection circuits 20 and 30, generate a first detection value and a second detection value respectively having correspondences with components of a magnetic field in two different directions at a predetermined reference position. In particular, in the present example embodiment, the foregoing two different directions are a direction parallel to an XY plane and a direction parallel to the Z direction. For example, the processor 40 is constructed of an application-specific integrated circuit (ASIC).

The processor 40 may be included in a support supporting the magnetic sensor 1, for example. The support includes a plurality of electrode pads. The first and second detection circuits 20 and 30 are connected to the processor 40 via the plurality of electrode pads of the magnetic sensor 1, the plurality of electrode pads of the support, and a plurality of bonding wires, for example. In a case where the plurality of electrode pads of the magnetic sensor 1 are provided on the top surface 1a of the magnetic sensor 1, the magnetic sensor 1 may be mounted on the top surface of the support in such a posture that the bottom surface of the magnetic sensor 1 faces the top surface of the support.

Figure 3:
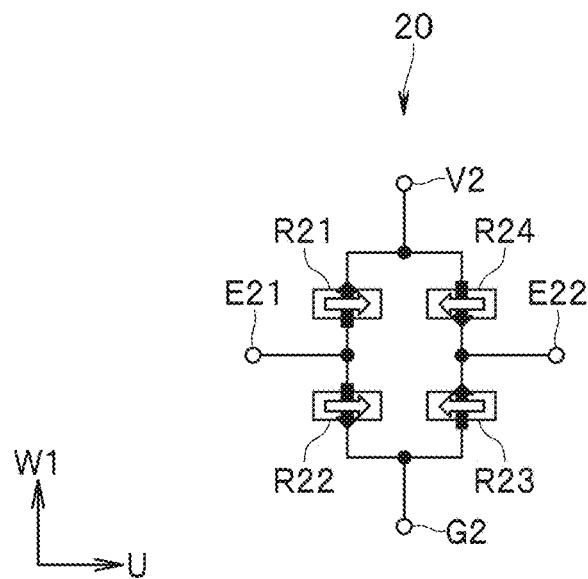
FIG. 3 is a circuit diagram showing a circuit configuration of a first detection circuit of the first example embodiment of the technology.
Figure 4:
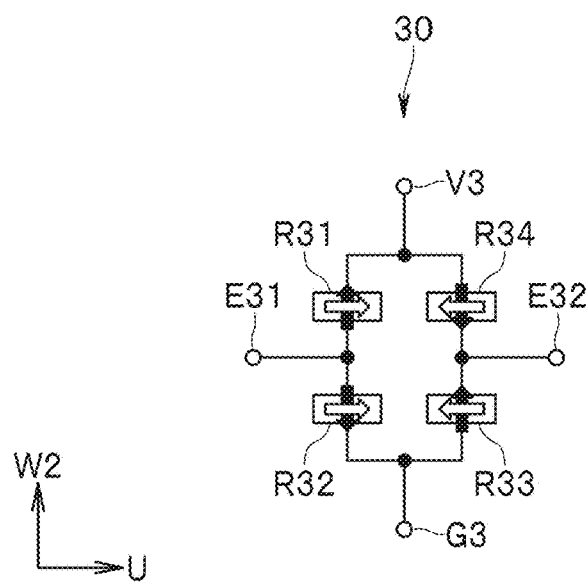
FIG. 4 is a circuit diagram showing a circuit configuration of a second detection circuit of the first example embodiment of the technology.
Figure 5:
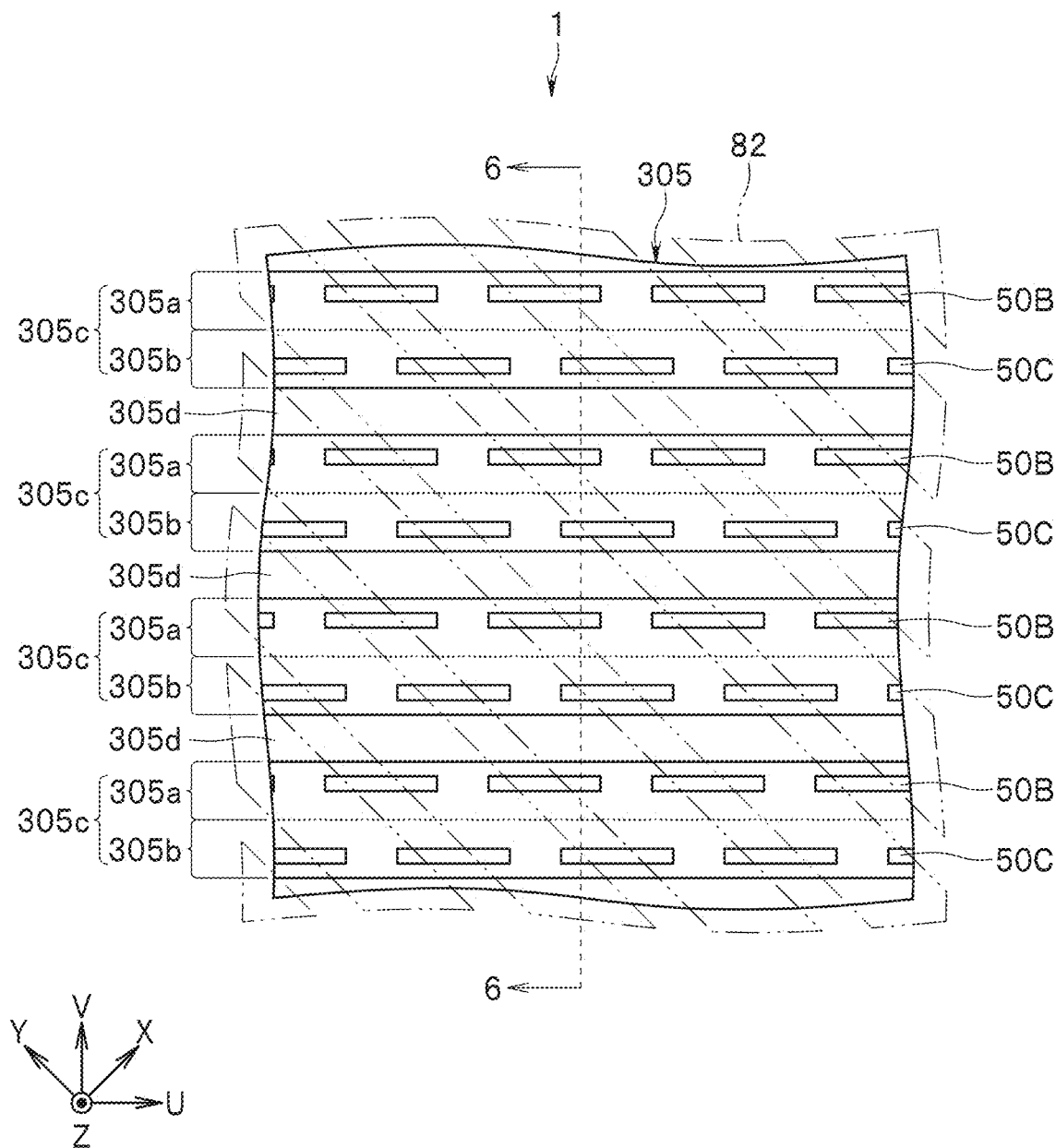
FIG. 5 is a plan view showing a part of the magnetic sensor according to the first example embodiment of the technology.
Figure 6:
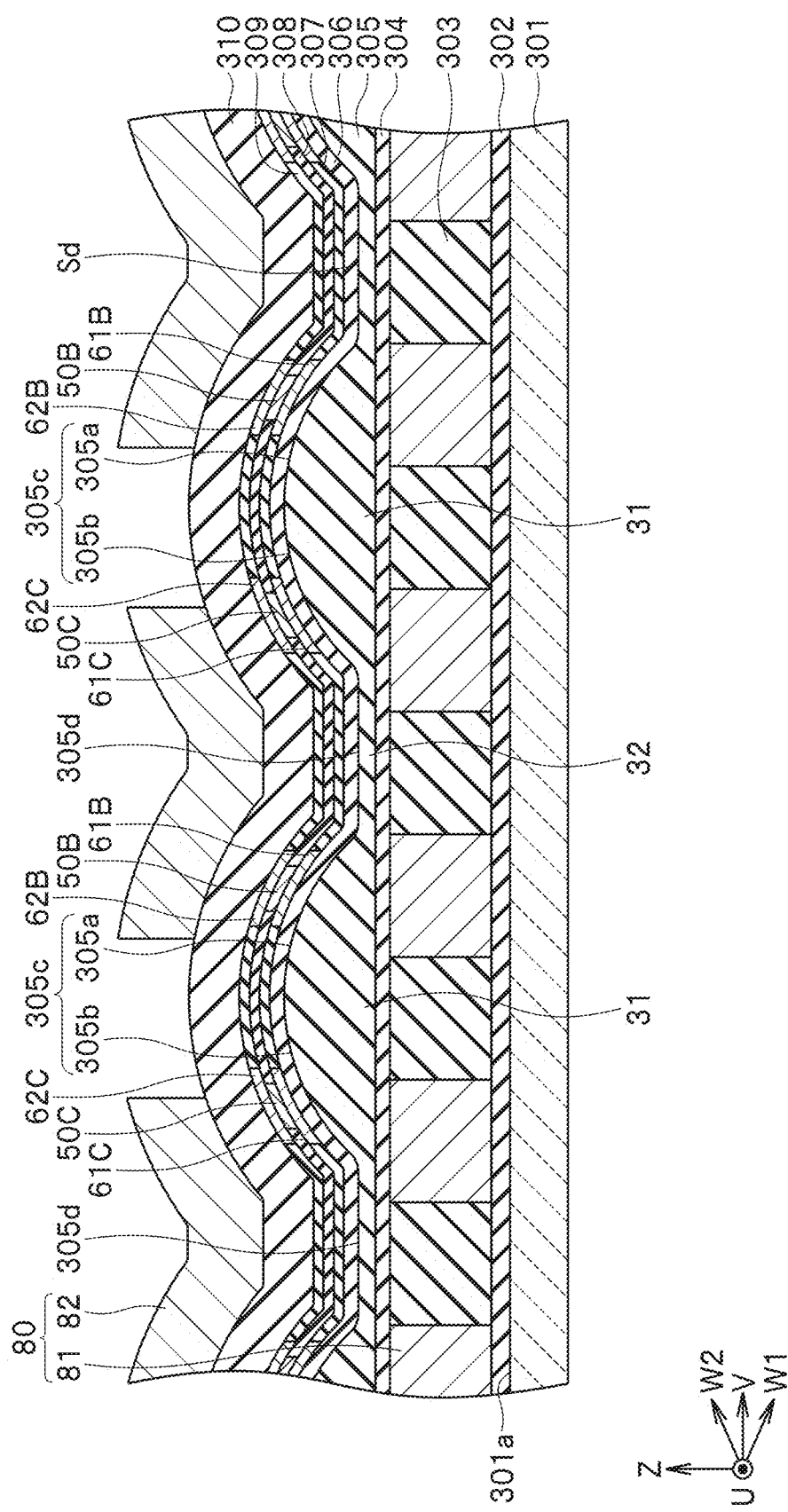
FIG. 6 is a sectional view showing a part of the magnetic sensor according to the first example embodiment of the technology.

Next, the first and second detection circuits 20 and 30 will be described with reference to FIGS. 3 to 6. FIG. 3 is a circuit diagram showing a circuit configuration of the first detection circuit 20. FIG. 4 is a circuit diagram showing a circuit configuration of the second detection circuit 30. FIG. 5 is a plan view showing a part of the magnetic sensor 1. FIG. 6 is a sectional view showing a part of the magnetic sensor 1.

Here, as shown in FIG. 5, a U direction and a V direction are defined as follows. The U direction is a direction rotated from the X direction to the −Y direction. The V direction is a direction rotated from the Y direction to the X direction. More specifically, in the present example embodiment, the U direction is set to a direction rotated from the X direction to the −Y direction by α, and the V direction is set to a direction rotated from the Y direction to the X direction by α. Note that α is an angle greater than 0° and smaller than 90°. For example, α is 45°. −U direction refers to a direction opposite to the U direction, and −V direction refers to a direction opposite to the V direction.

As shown in FIG. 6, a W1 direction and a W2 direction are defined as follows. The W1 direction is a direction rotated from the V direction to the −Z direction. The W2 direction is a direction rotated from the V direction to the Z direction. More specifically, in the present example embodiment, the W1 direction is set to a direction rotated from the V direction to the −Z direction by β, and the W2 direction is set to a direction rotated from the V direction to the Z direction by β. Note that β is an angle greater than 0° and smaller than 90°. −W1 direction refers to a direction opposite to the W1 direction, and −W2 direction refers to a direction opposite to the W2 direction. The W1 direction and W2 direction both are orthogonal to the U direction.

The first detection circuit 20 is configured to detect a component of the target magnetic field in a direction parallel to the W1 direction and generate at least one first detection signal which has a correspondence with the component. The second detection circuit 30 is configured to detect a component of the target magnetic field in a direction parallel to the W2 direction and generate at least one second detection signal which has a correspondence with the component.

As shown in FIG. 3, the first detection circuit 20 includes a power supply port V2, a ground port G2, signal output ports E21 and E22, a first resistor section R21, a second resistor section R22, a third resistor section R23, and a fourth resistor section R24. The plurality of MR elements of the first detection circuit 20 constitute the first to fourth resistor sections R21, R22, R23, and R24.

The first resistor section R21 is provided between the power supply port V2 and the signal output port E21. The second resistor section R22 is provided between the signal output port E21 and the ground port G2. The third resistor section R23 is provided between the signal output port E22 and the ground port G2. The fourth resistor section R24 is provided between the power supply port V2 and the signal output port E22.

As shown in FIG. 4, the second detection circuit 30 includes a power supply port V3, a ground port G3, signal output ports E31 and E32, a first resistor section R31, a second resistor section R32, a third resistor section R33, and a fourth resistor section R34. The plurality of MR elements of the second detection circuit 30 constitute the first to fourth resistor sections R31, R32, R33, and R34.

The first resistor section R31 is provided between the power supply port V3 and the signal output port E31. The second resistor section R32 is provided between the signal output port E31 and the ground port G3. The third resistor section R33 is provided between the signal output port E32 and the ground port G3. The fourth resistor section R34 is provided between the power supply port V3 and the signal output port E32.

A voltage or current of a predetermined magnitude is applied to each of the power supply ports V2 and V3. Each of the ground ports G2 and G3 is connected to the ground.

The plurality of MR elements of the first detection circuit 20 will be referred to as a plurality of first MR elements 50B. The plurality of MR elements of the second detection circuit 30 will be referred to as a plurality of second MR elements 50C. Since the first and second detection circuits 20 and 30 are the components of the magnetic sensor 1, it can be said that the magnetic sensor 1 includes the plurality of first MR elements 50B and the plurality of second MR elements 50C. Any given MR element will be denoted by the reference numeral 50.

Figure 7:
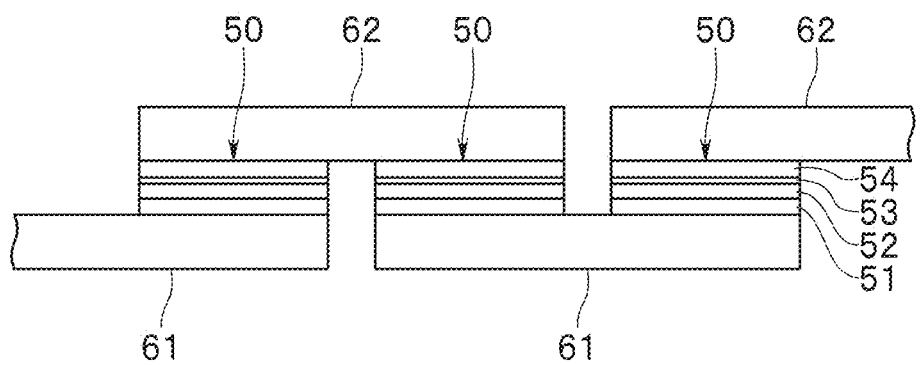
FIG. 7 is a side view showing a magnetoresistive element of the first example embodiment of the technology.

FIG. 7 is a side view showing an MR element 50. The MR element 50 is specifically a spin-valve MR element. The MR element 50 includes a magnetization pinned layer 52 having a magnetization whose direction is fixed, a free layer 54 having a magnetization whose direction is variable depending on the direction of a target magnetic field, and a gap layer 53 located between the magnetization pinned layer 52 and the free layer 54. The MR element 50 may be a tunneling magnetoresistive (TMR) element or a giant magnetoresistive (GMR) element. In the TMR element, the gap layer 53 is a tunnel barrier layer. In the GMR element, the gap layer 53 is a nonmagnetic conductive layer. The resistance of the MR element 50 changes with the angle that the magnetization direction of the free layer 54 forms with respect to the magnetization direction of the magnetization pinned layer 52. The resistance of the MR element 50 is at its minimum value when the foregoing angle is 0°, and at its maximum value when the foregoing angle is 180°. In each MR element 50, the free layer 54 has a shape anisotropy that sets the direction of the magnetization easy axis to be orthogonal to the magnetization direction of the magnetization pinned layer 52. As a method for setting the magnetization easy axis in a predetermined direction in the free layer 54, a magnet configured to apply a bias magnetic field to the free layer 54 can be used.

The MR element 50 further includes an antiferromagnetic layer 51. The antiferromagnetic layer 51, the magnetization pinned layer 52, the gap layer 53, and the free layer 54 are stacked in this order. The antiferromagnetic layer 51 is formed of an antiferromagnetic material, and is in exchange coupling with the magnetization pinned layer 52 to thereby pin the magnetization direction of the magnetization pinned layer 52. The magnetization pinned layer 52 may be a so-called self-pinned layer (Synthetic Ferri Pinned layer, SFP layer). The self-pinned layer has a stacked ferri structure in which a ferromagnetic layer, a nonmagnetic intermediate layer, and a ferromagnetic layer are stacked, and the two ferromagnetic layers are antiferromagnetically coupled. In a case where the magnetization pinned layer 52 is the self-pinned layer, the antiferromagnetic layer 51 may be omitted.

It should be appreciated that the layers 51 to 54 of each MR element 50 may be stacked in the reverse order to that shown in FIG. 7.

In FIGS. 3 and 4, solid arrows represent the magnetization directions of the magnetization pinned layers 52 of the MR elements 50. Hollow arrows represent the magnetization directions of the free layers 54 of the MR elements 50 in a case where no target magnetic field is applied to the MR elements 50.

In the example shown in FIG. 3, the magnetization directions of the magnetization pinned layers 52 in each of the first and third resistor sections R21 and R23 are the W1 direction. The magnetization directions of the magnetization pinned layers 52 in each of the second and fourth resistor sections R22 and R24 are the −W1 direction. The free layer 54 in each of the plurality of first MR elements 50B has a shape anisotropy that sets the direction of the magnetization easy axis to a direction parallel to the U direction. The magnetization directions of the free layers 54 in each of the first and second resistor sections R21 and R22 in a case where no target magnetic field is applied to the first MR elements 50B are the U direction. The magnetization directions of the free layers 54 in each of the third and fourth resistor sections R23 and R24 in the foregoing case are the −U direction.

In the example shown in FIG. 4, the magnetization directions of the magnetization pinned layers 52 in each of the first and third resistor sections R31 and R33 are the W2 direction. The magnetization directions of the magnetization pinned layers 52 in each of the second and fourth resistor sections R32 and R34 are the −W2 direction. The free layer 54 in each of the plurality of second MR elements 50C has a shape anisotropy that sets the direction of the magnetization easy axis to a direction parallel to the U direction. The magnetization directions of the free layers 54 in each of the first and second resistor sections R31 and R32 in a case where no target magnetic field is applied to the second MR elements 50C are the U direction. The magnetization directions of the free layers 54 in each of the third and fourth resistor sections R33 and R34 in the foregoing case are the −U direction.

The magnetic sensor 1 includes a magnetic field generator configured to apply a magnetic field in a predetermined direction to the free layer 54 of each of the plurality of first MR elements 50B, and the plurality of second MR elements 50C. In the present example embodiment, the magnetic field generator includes a coil 80 that applies a magnetic field in the predetermined direction to the free layer 54 in each of the plurality of first MR elements 50B and the plurality of second MR elements 50C.

Note that the magnetization directions of the magnetization pinned layers 52 and the directions of the magnetization easy axes of the free layers 54 may slightly deviate from the foregoing directions from the perspective of the accuracy of the manufacturing of the MR elements 50 and the like. The magnetization pinned layer 52 may be magnetized so as to include magnetization components in the foregoing directions as their main components. In such a case, the magnetization directions of the magnetization pinned layers 52 are the same of substantially the same as the foregoing direction.

Hereinafter, a specific structure of the magnetic sensor 1 will be described in detail with reference to FIGS. 5 and 6. FIG. 6 shows a part of a cross section at a position indicated by the line 6-6 in FIG. 5.

The magnetic sensor 1 includes a substrate 301 with a top surface 301a, insulating layers 302, 303, 304, 305, 306, 307, 308, 309, and 310, a plurality of lower electrodes 61B, a plurality of lower electrodes 61C, a plurality of upper electrodes 62B, a plurality of upper electrodes 62C, a plurality of lower coil elements 81, and a plurality of upper coil elements 82. It is assumed that the top surface 301a of the substrate 301 is parallel to the XY plane. The Z direction is also a direction perpendicular to the top surface 301a of the substrate 301. The coil elements are a part of the coil winding.

The insulating layer 302 is disposed on the substrate 301. The plurality of lower coil elements 81 are disposed on the insulating layer 302. The insulating layer 303 is disposed around the plurality of lower coil elements 81 on the insulating layer 302. The insulating layers 304, 305, and 306 are stacked in this order on the plurality of lower coil elements 81 and the insulating layer 303.

The plurality of lower electrodes 61B and the plurality of lower electrodes 61C are disposed on the insulating layer 306. The insulating layer 307 is disposed around the plurality of lower electrodes 61B and the plurality of lower electrodes 61C on the insulating layer 306. The plurality of first MR elements 50B are disposed on the plurality of lower electrodes 61B. The plurality of second MR elements 50C are disposed on the plurality of lower electrodes 61C. The insulating layer 308 is disposed around the plurality of first MR elements 50B and the plurality of second MR elements 50C on the plurality of lower electrodes 61B, the plurality of lower electrodes 61C, and the insulating layer 307. The plurality of upper electrodes 62B are disposed on the plurality of first MR elements 50B and the insulating layer 308. The plurality of upper electrodes 62C are disposed on the plurality of second MR elements 50C and the insulating layer 308. The insulating layer 309 is disposed around the plurality of upper electrodes 62B and the plurality of upper electrodes 62C on the insulating layer 308.

The insulating layer 310 is disposed on the plurality of upper electrodes 62B, the plurality of upper electrodes 62C, and the insulating layer 309. The plurality of upper coil elements 82 are disposed on the insulating layer 310. The magnetic sensor 1 may further include a not-shown insulating layer that covers the plurality of upper coil elements 82 and the insulating layer 310.

The magnetic sensor 1 includes a support member supporting the plurality of first MR elements 50B and the plurality of second MR elements 50C. The support member includes at least one inclined surface inclined with respect to the top surface 301a of the substrate 301. In particular, in the example embodiment, the support member includes the insulating layer 305. Note that FIG. 5 shows the insulating layer 305, the plurality of first MR elements 50B, the plurality of second MR elements 50C, and the plurality of upper coil elements 82 among the components of the magnetic sensor 1.

The insulating layer 305 includes a plurality of protruding surfaces 305c each protruding in a direction (the Z direction) away from the top surface 301a of the substrate 301. Each of the plurality of protruding surfaces 305c extends in a direction parallel to the U direction. The overall shape of each of the protruding surfaces 305c is a semi-cylindrical curved surface formed by moving the curved shape (arch shape) of the protruding surface 305c shown in FIG. 6 along the direction parallel to the U direction. The plurality of protruding surfaces 305c are arranged at predetermined intervals along a direction parallel to the V direction.

Each of the plurality of protruding surfaces 305c includes an upper end portion farthest from the top surface 301a of the substrate 301. In the example embodiment, each of the upper end portions of the plurality of protruding surfaces 305c extends in the direction parallel to the U direction. Herein, focus is placed on a given protruding surface 305c of the plurality of protruding surfaces 305c. The protruding surface 305c includes a first inclined surface 305a and a second inclined surface 305b. The first inclined surface 305a refers to the part of the protruding surface 305c on the side of the V direction of the upper end portion of the protruding surface 305c. The second inclined surface 305b refers to the part of the protruding surface 305c on the side of the −V direction of the upper end portion of the protruding surface 305c. In FIG. 5, a boundary between the first inclined surface 305a and the second inclined surface 305b is indicated by a dotted line.

The upper end portion of the protruding surface 305c may be the boundary between the first inclined surface 305a and the second inclined surface 305b. In such a case, the dotted line shown in FIG. 5 indicates the upper end portion of the protruding surface 305c.

The top surface 301a of the substrate 301 is parallel to the XY plane. Each of the first inclined surface 305a and the second inclined surface 305b is inclined with respect to the top surface 301a of the substrate 301, that is, the XY plane. In a cross section perpendicular to the top surface 301a of the substrate 301, a distance between the first inclined surface 305a and the second inclined surface 305b becomes smaller in a direction away from the top surface 301a of the substrate 301.

In the example embodiment, since two or more protruding surface 305c are present, the number of each of the first inclined surfaces 305a and the second inclined surfaces 305b is also two or more. The insulating layer 305 includes the plurality of first inclined surfaces 305a and the plurality of second inclined surfaces 305b.

The insulating layer 305 further includes a flat surface 305d present around the plurality of protruding surfaces 305c. The flat surface 305d is a surface parallel to the top surface 301a of the substrate 301. Each of the plurality of protruding surfaces 305c protrudes in the Z direction from the flat surface 305d. In the example embodiment, the plurality of protruding surfaces 305c are disposed at predetermined intervals. Thus, the flat surface 305d is present between the two protruding surfaces 305c adjoining in the V direction.

The insulating layer 305 includes a flat portion 32 including a flat surface 305d, and at least one protruding portion shaped to protrude from the flat surface 305d. In particular, in the example embodiment, the at least one protruding portion includes a plurality of protruding portions 31. Each of the plurality of protruding portions 31 is shaped to protrude in the Z direction. Each of the plurality of protruding portions 31 extends in the direction parallel to the U direction, and includes the protruding surface 305c. In the example embodiment, since each of the first inclined surface 305a and the second inclined surface 305b is a part of the protruding surface 305c, it can be said that each of the plurality of protruding portions 31 includes the first inclined surface 305a and the second inclined surface 305b.

The plurality of protruding portions 31 are arranged at predetermined intervals in the direction parallel to the V direction. The flat portion 32 is present around the plurality of protruding portions 31. The thickness (the dimension in the Z direction) of the flat portion 32 is substantially constant.

Note that the insulating layer 304 has a substantially constant thickness (i.e., a dimension in the Z direction), and is formed along the bottom surface of the insulating layer 305. The insulating layer 306 has a substantially constant thickness (i.e., a dimension in the Z direction), and is formed along the top surface of the insulating layer 305.

The plurality of lower electrodes 61B are disposed on the plurality of first inclined surfaces 305a. The plurality of lower electrodes 61C are disposed on the plurality of second inclined surfaces 305b. As described above, since each of the first inclined surfaces 305a and the second inclined surfaces 305b is inclined with respect to the top surface 301a of the substrate 301, that is, the XY plane, each of the top surfaces of the plurality of lower electrodes 61B and each of the top surfaces of the plurality of lower electrodes 61C are also inclined with respect to the XY plane. Thus, it can be said that the plurality of first MR elements 50B and the plurality of second MR elements 50C are disposed on the inclined surfaces inclined with respect to the XY plane. The insulating layer 305 is a member for supporting each of the plurality of first MR elements 50B and the plurality of second MR elements 50C so as to allow such MR elements to be inclined with respect to the XY plane.

Note that in the example embodiment, the first inclined surfaces 305a are curved surfaces. Therefore, the first MR elements 50B are curved along the curved surfaces (the first inclined surfaces 305a). For the sake of convenience, in the present example embodiment, the magnetization directions of the magnetization pinned layers 52 of the first MR elements 50B are defined as straight directions as described above. The W1 direction and the −W1 direction that are the magnetization directions of the magnetization pinned layers 52 of the first MR elements 50B are also directions in which the tangents to the first inclined surfaces 305a at the vicinity of the first MR elements 50B extend.

Similarly, in the example embodiment, the second inclined surfaces 305b are curved surfaces. Therefore, the second MR elements 50C are curved along the curved surfaces (the second inclined surfaces 305b). For the sake of convenience, in the present example embodiment, the magnetization directions of the magnetization pinned layers 52 of the second MR elements 50C are defined as straight directions as described above. The W2 direction and the −W2 direction that are the magnetization directions of the magnetization pinned layers 52 of the second MR elements 50C are also directions in which the tangents to the second inclined surfaces 305b at the vicinity of the second MR elements 50C extend.

As shown in FIG. 5, the plurality of first MR elements 50B are disposed so that two or more MR elements 50B are arranged both in the U direction and in the V direction. The plurality of first MR elements 50B are aligned in a row on one first inclined surface 305a. Similarly, the plurality of second MR elements 50C are disposed so that two or more MR elements 50C are arranged both in the U direction and in the V direction. The plurality of second MR elements 50C are aligned in a row on one second inclined surface 305b. In the example embodiment, the row of the plurality of first MR elements 50B and the row of the plurality of second MR elements 50C are alternately arranged in the direction parallel to the V direction.

Note that one first MR element 50B and one second MR element 50C adjoining each other may or may not deviate in the direction parallel to the U direction when seen in the Z direction. Two first MR elements 50B adjoining each other across one second MR element 50C may or may not deviate in the direction parallel to the U direction when seen in the Z direction. Two second MR elements 50C adjoining each other across one first MR element 50B may or may not deviate in the direction parallel to the U direction when seen in the Z direction.

The plurality of first MR elements 50B are connected in series by the plurality of lower electrodes 61B and the plurality of upper electrodes 62B. Herein, a method for connecting the plurality of first MR elements 50B will be described in detail with reference to FIG. 7. In FIG. 7, the reference sign 61 denotes a lower electrode corresponding to a given MR element 50, and the reference numeral 62 denotes an upper electrode corresponding to the given MR element 50. As shown in FIG. 7, each lower electrode 61 has a long slender shape. Two lower electrodes 61 adjoining in the longitudinal direction of the lower electrodes 61 have a gap therebetween. MR elements 50 are disposed near both longitudinal ends on the top surface of each lower electrode 61. Each upper electrode 62 has a long slender shape, and electrically connects two adjoining MR elements 50 that are disposed on two lower electrodes 61 adjoining in the longitudinal direction of the lower electrodes 61.

Although not shown, one MR element 50 located at the end of a row of a plurality of aligned MR elements 50 is connected to another MR element 50 located at the end of another row of a plurality of MR elements 50 adjoining in a direction intersecting with the longitudinal direction of the lower electrodes 61. Such two MR elements 50 are connected to each other by a not-shown specific electrode. The specific electrode may be an electrode that connects the bottom surfaces or the top surfaces of the two MR elements 50.

In a case where the MR elements 50 shown in FIG. 7 are the first MR elements 50B, the lower electrodes 61 shown in FIG. 7 correspond to the lower electrodes 61B, and the upper electrodes 62 shown in FIG. 7 correspond to the upper electrodes 62B. In such a case, the longitudinal direction of the lower electrodes 61 is parallel to the U direction.

Similarly, the plurality of second MR elements 50C are connected in series by the plurality of lower electrodes 61C and the plurality of upper electrodes 62C. The foregoing description of the method for connecting the plurality of first MR elements 50B holds true for the method for connecting the plurality of second MR elements 50C. In a case where the MR elements 50 shown in FIG. 7 are the second MR elements 50C, the lower electrodes 61 shown in FIG. 7 correspond to the lower electrodes 61C, and the upper electrodes 62 shown in FIG. 7 correspond to the upper electrodes 62C. In such a case, the longitudinal direction of the lower electrodes 61 is parallel to the U direction.

Note that in the example embodiment, a stacked film including the antiferromagnetic layer 51, the magnetization pinned layer 52, the gap layer 53, and the free layer 54 is described as the MR element 50. However, the MR element of the example embodiment may also be an element including such a stacked film, the lower electrode 61, and the upper electrode 62. The stacked film includes a plurality of magnetic films. The lower electrode 61 is a nonmagnetic metal layer disposed between the protruding surface 305c and the plurality of magnetic films. The MR element may also include a plurality of stacked films, a plurality of lower electrodes 61, and a plurality of upper electrodes 62.

Each of the plurality of upper coil elements 82 extends in a direction parallel to the Y direction. The plurality of upper coil elements 82 are arranged in the X direction. In particular, in the present example embodiment, when seen in the Z direction, each of the plurality of first MR elements 50B and the plurality of second MR elements 50C overlaps two upper coil elements 82.

Each of the plurality of lower coil elements 81 extends in a direction parallel to the Y direction. The plurality of lower coil elements 81 are arranged in the X direction. The shape and arrangement of the plurality of lower coil elements 81 may be the same as or different from those of the plurality of upper coil elements 82. In the example shown in FIGS. 5 and 6, the dimension in the X direction of each of the plurality of lower coil elements 81 is smaller than the dimension in the X direction of each of the plurality of upper coil elements 82. The distance between two lower coil elements 81 adjoining in the X direction is smaller than the distance between two upper coil elements 82 adjoining in the X direction.

In the example shown in FIGS. 5 and 6, the plurality of lower coil elements 81 and the plurality of upper coil elements 82 are electrically connected so as to constitute the coil 80 that applies a magnetic field in a direction parallel to the X direction to the free layer 54 in each of the plurality of first MR elements 50B and the plurality of second MR elements 50C. Alternatively, the coil 80 may be configured to be able to, for example, apply a magnetic field in the X direction to the free layers 54 in the first and second resistor sections R21 and R22 of the first detection circuit 20 and the first and second resistor sections R31 and R32 of the second detection circuit 30, and apply a magnetic field in the −X direction to the free layers 54 in the third and fourth resistor sections R23 and R24 of the first detection circuit 20 and the third and fourth resistor sections R33 and R34 of the second detection circuit 30. The coil 80 may be controlled by the processor 40.

Next, the first and second detection signals will be described. First, the first detection signal will be described with reference to FIG. 3. As the strength of the component of the target magnetic field in the direction parallel to the W1 direction changes, the resistance of each of the resistor sections R21 to R24 of the first detection circuit 20 changes either so that the resistances of the resistor sections R21 and R23 increase and the resistances of the resistor sections R22 and R24 decrease or so that the resistances of the resistor sections R21 and R23 decrease and the resistances of the resistor sections R22 and R24 increase. Thereby the electric potential of each of the signal output ports E21 and E22 changes. The first detection circuit 20 generates a signal corresponding to the electric potential of the signal output port E21 as a first detection signal S21, and generates a signal corresponding to the electric potential of the signal output port E22 as a first detection signal S22.

Next, the second detection signal will be described with reference to FIG. 4. As the strength of the component of the target magnetic field in the direction parallel to the W2 direction changes, the resistance of each of the resistor sections R31 to R34 of the second detection circuit 30 changes either so that the resistances of the resistor sections R31 and R33 increase and the resistances of the resistor sections R32 and R34 decrease or so that the resistances of the resistor sections R31 and R33 decrease and the resistances of the resistor sections R32 and R34 increase. Thereby the electric potential of each of the signal output ports E31 and E32 changes. The second detection circuit 30 generates a signal corresponding to the electric potential of the signal output port E31 as a second detection signal S31, and generates a signal corresponding to the electric potential of the signal output port E32 as a second detection signal S32.

Next, the operation of the processor 40 will be described. The processor 40 is configured to generate the first detection value and the second detection value based on the first detection signals S21 and S22 and the second detection signals S31 and S32. The first detection value is a detection value corresponding to the component of the target magnetic field in the direction parallel to the V direction. The second detection value is a detection value corresponding to the component of the target magnetic field in the direction parallel to the Z direction. The first detection value is represented by a symbol Sv, and the second detection value is represented by a symbol Sz.

The processor 40 generates the first and second detection values Sv and Sz as follows, for example. First, the processor 40 generates a value S1 by an arithmetic including obtainment of the difference S21-S22 between the first detection signal S21 and the first detection signal S22, and generates a value S2 by an arithmetic including obtainment of the difference S31-S32 between the second detection signal S31 and the second detection signal S32. Next, the processor 40 calculates values S3 and S4 using the following expressions (1) and (2).

$$S3 = (S2 + S1)/(2\cos\alpha) \quad (1)$$

$$S4 = (S2 - S1)/(2\sin\alpha) \quad (2)$$

The first detection value Sv may be the value S3 itself, or may be a result of a predetermined correction, such as a gain adjustment or an offset adjustment, made to the value S3. In the same manner, the second detection value Sz may be the value S4 itself, or may be a result of a predetermined correction, such as a gain adjustment or an offset adjustment, made to the value S4.

Next, features of the structure of the magnetic sensor 1 according to the example embodiment will be described. The magnetic sensor 1 includes the substrate 301 with the top surface 301a, the support member disposed on the substrate 301, the first MR elements 50B, and the second MR elements 50C. In particular, in the example embodiment, the insulating layer 305 corresponds to the support member. The plurality of lower coil elements 81 and the insulating layers 302 to 304 are provided between the substrate 301 and the insulating layer 305. The insulating layer 305 includes the first inclined surfaces 305a and the second inclined surfaces 305b.

Each of the first and second MR elements 50B and 50C includes at least two magnetic films, that is, the magnetization pinned layer 52 and the free layer 54. The two magnetic films of each first MR element 50B form a part (a main part) of the first MR element 50B. The two magnetic films of each second MR element 50C form a part (a main part) of the second MR element 50C. Hereinafter, such two magnetic films will be referred to as functional layers. The functional layers of the first MR elements 50B are disposed on the first inclined surfaces 305a. The functional layers of the second MR elements 50C are disposed on the second inclined surfaces 305b.

The first inclined surface 305a and the second inclined surface 305b face different directions. Regarding one protruding surface 305c, the first inclined surface 305a and the second inclined surface 305b may be symmetrical about a virtual UZ plane perpendicular to the top surface 301a of the substrate 301 as the center.

From the perspective of reducing the height of the magnetic sensor 1, the dimension of each of the first inclined surface 305a and the second inclined surface 305b in the direction perpendicular to the top surface 301a of the substrate 301, that is, the direction parallel to the Z direction is preferably in the range of 1.4 μm to 3.0 μm.

The insulating layer 305 includes the protruding surfaces 305c. Each protruding surface 305c protrudes in the direction away from the top surface 301a of the substrate 301. At least a part of each protruding surface 305c is inclined with respect to the top surface 301a of the substrate 301. In particular, in the example embodiment, each protruding surface 305c includes the first inclined surface 305a and the second inclined surface 305b.

The dimension of the protruding surface 305c in the direction perpendicular to the top surface 301a of the substrate 301, that is, the direction parallel to the Z direction is the same as the dimension of each of the first and second inclined surfaces 305a and 305b in the direction parallel to the Z direction. In other words, the dimension of the protruding surface 305c in the direction parallel to the Z direction is preferably in the range from 1.4 μm or more to 3.0 μm or less. The dimension of the protruding surface 305c in the direction parallel to the V direction is preferably greater than or equal to 3 μm and less than or equal to 16 μm, for example.

Figure 8:
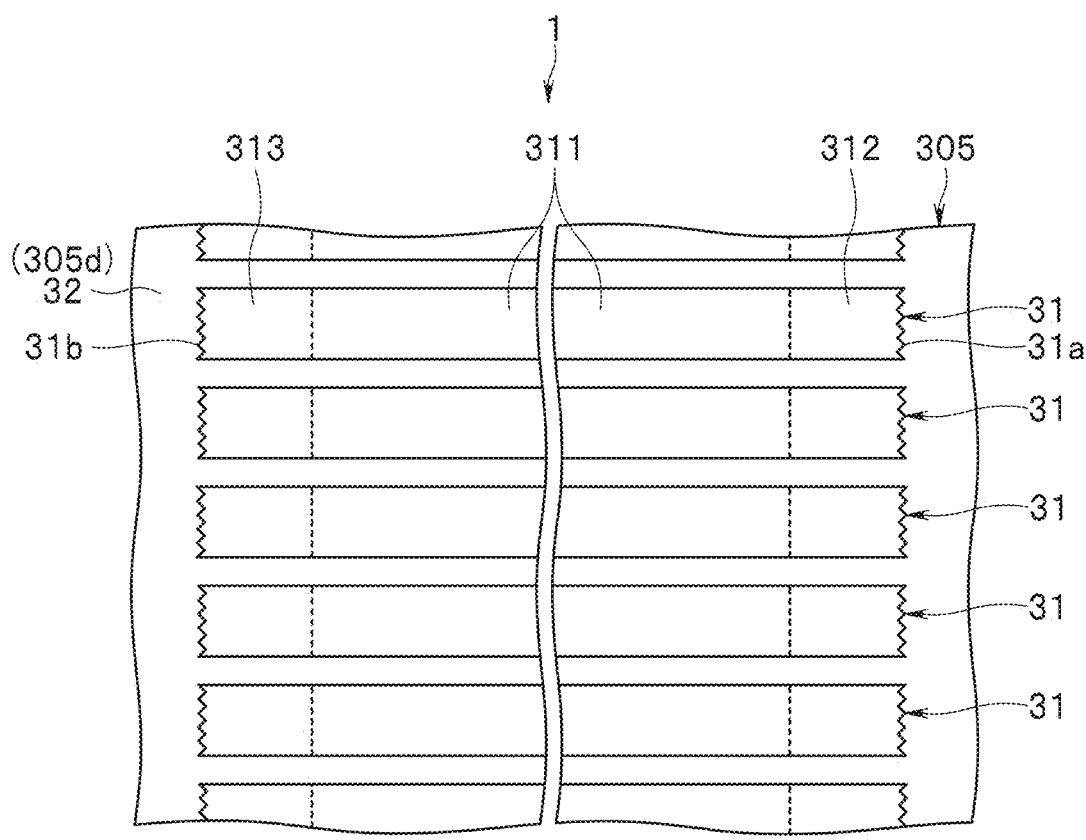
FIG. 8 is a plan view showing a support member of the first example embodiment of the technology.

The insulating layer 305 includes the flat portion 32 and the plurality of protruding portions 31. Hereinafter, focus will be placed on one protruding portion 31, and the shape of the protruding portion 31 will be described in detail. FIG. 8 is a plan view showing the support member, that is, the insulating layer 305.

The protruding portion 31 extends in the U direction parallel to the top surface 301a of the substrate 301, and includes an end portion 31a located at an end in the U direction, and an end portion 31b located at an end in the −U direction. As shown in FIG. 8, each of the end portions 31a and 31b when seen in the Z direction has a shape including protrusions and recesses, such as a periodic saw-tooth shape. The shape of each of the end portions 31a and 31b will be described in detail later.

The protruding portion 31 includes a first portion 311, a second portion 312 located forward of the first portion 311 in the U direction, and a third portion 313 located forward of the first portion 311 in the −U direction. In FIG. 8, each of a boundary between the first portion 311 and the second portion 312 and a boundary between the first portion 311 and the third portion 313 is indicated by a dashed line. The second portion 312 includes the end portion 31a. The third portion 313 includes the end portion 31b.

The first portion 311 is a main portion of the protruding portion 31. Though not shown, functional layers (the magnetization pinned layer 52 and the free layer 54) of each of the first and second MR elements 50B and 50C are disposed on the first portion 311. Meanwhile, the functional layers need not be disposed on the second and third portions 312 and 313.

The lower electrodes 61, the upper electrodes 62, and the foregoing not-shown specific electrode may be, or may not be, disposed on the second and third portions 312 and 313. In addition, the upper coil elements 82 may be, or may not be, disposed on the second and third portions 312 and 313.

Figure 9:
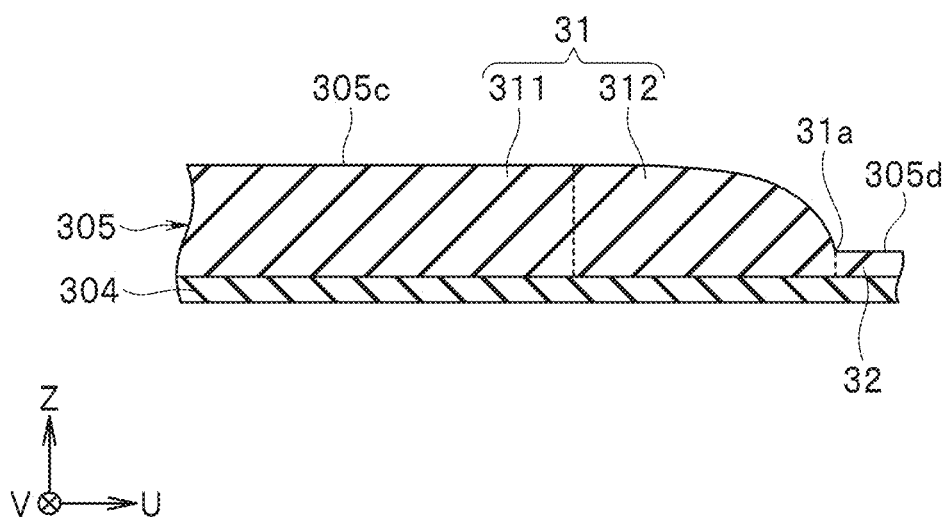
FIG. 9 is a sectional view showing first and second portions of a protruding portion of the first example embodiment of the technology.
Figure 10:
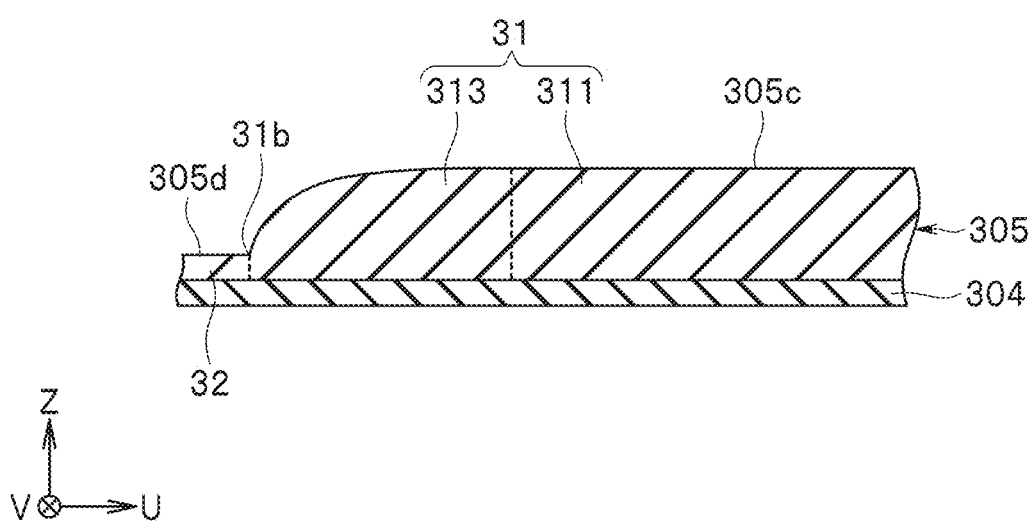
FIG. 10 is a sectional view showing first and third portions of the protruding portion of the first example embodiment of the technology.

FIG. 9 is a sectional view showing the first portion 311 and the second portion 312. In FIG. 9, each of a boundary between the protruding portion 31 and the flat portion 32 and a boundary between the first portion 311 and the second portion 312 is indicated by a dashed line. The maximum dimension of the first portion 311 in the Z direction (the maximum thickness of the first portion 311) is constant or almost constant. In addition, the dimension of the first portion 311 in the Z direction (the thickness of the first portion 311) in any given cross section intersecting with the protruding portion 31 and parallel to the UZ plane is constant or almost constant.

The dimension of the second portion 312 in the Z direction (the thickness of the second portion 312) becomes smaller in a direction away from the first portion 311. In other words, the maximum dimension of the second portion 312 in the Z direction (the maximum thickness of the second portion 312) may become smaller in the direction away from the first portion 311. In addition, the dimension of the second portion 312 in the Z direction in any given cross section intersecting with the protruding portion 31 and parallel to the UZ plane may become smaller in the direction away from the first portion 311.

The dimension of the second portion 312 in the Z direction may be less than or equal to the dimension of the first portion 311 in the Z direction. In other words, the maximum dimension of the second portion 312 in the Z direction (the maximum thickness of the second portion 312) may be less than or equal to the maximum dimension of the first portion 311 in the Z direction (the maximum thickness of the first portion 311). In addition, the dimension of the second portion 312 in the Z direction (the thickness of the second portion 312) in any given cross section intersecting with the protruding portion 31 and parallel to the UZ plane may be less than or equal to the dimension of the first portion 311 in the Z direction (the thickness of the first portion 311).

The description of the dimension of the second portion 312 holds true for the third portion 313. Specifically, replacing the second portion 312 in the description of the dimension of the second portion 312 with the third portion 313 can provide a description of the dimension of the third portion 313.

The second portion 312 and the third portion 313 may have, or may not have, shapes symmetrical about the VZ plane intersecting with the center of the protruding portion 31 in the longitudinal direction.

Figure 11:
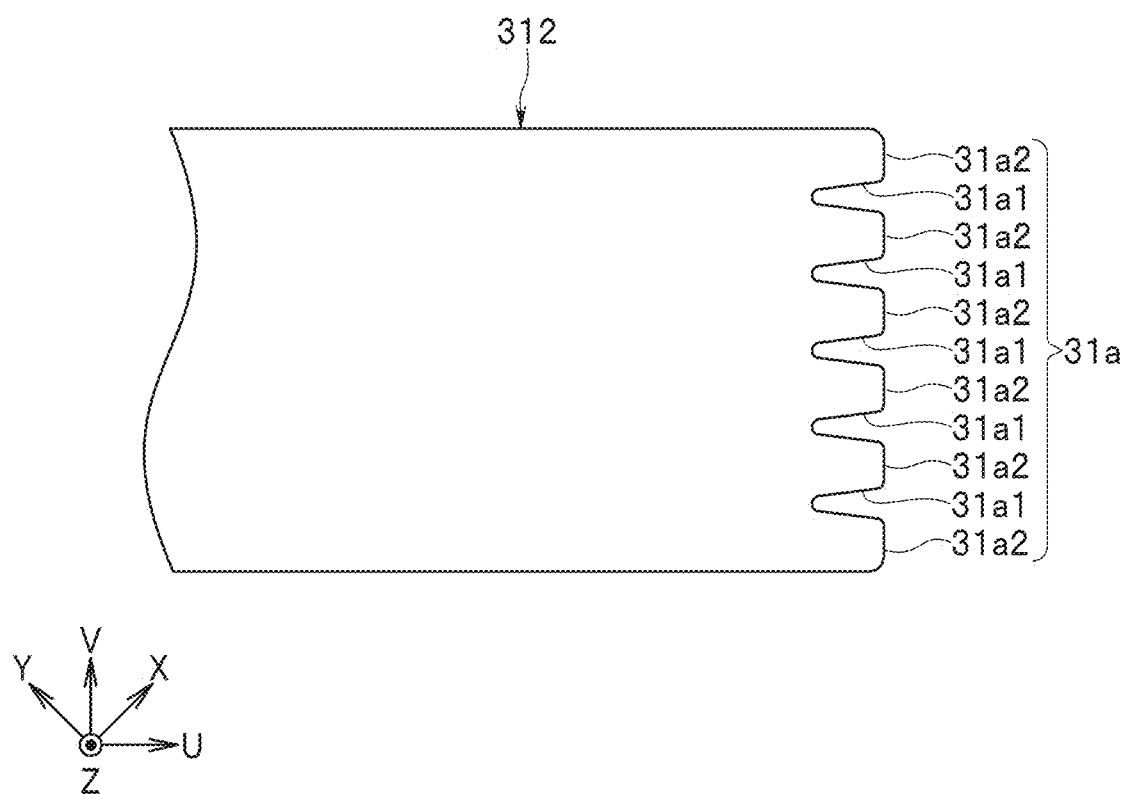
FIG. 11 is a plan view showing a plurality of recess portions of the first example embodiment of the technology.
Figure 12:
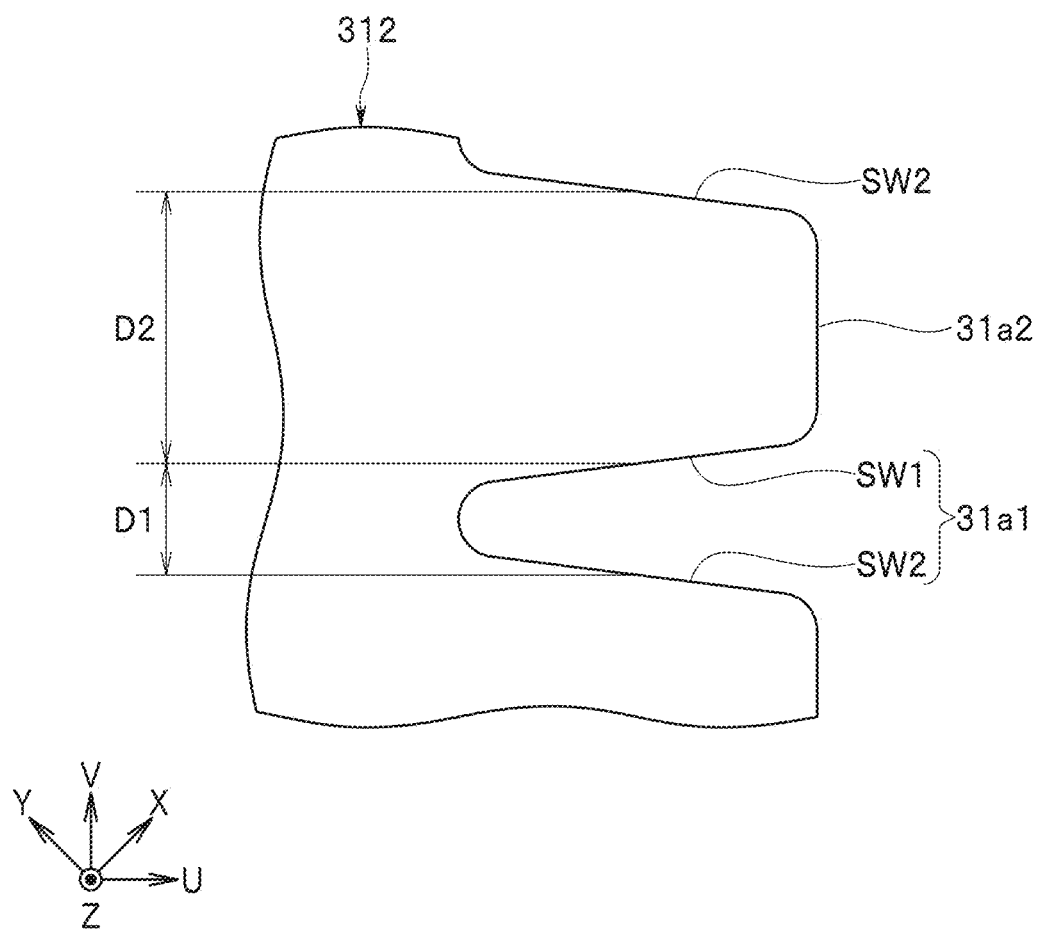
FIG. 12 is a plan view showing one of the plurality of recess portions shown in FIG. 11.

Next, the shape of the end portion 31a of the protruding portion 31 will be described in detail with reference to FIGS. 11 and 12. FIG. 11 is a plan view showing a plurality of recess portions. FIG. 12 is a plan view showing one of the plurality of recess portions shown in FIG. 11.

As shown in FIG. 11, the protruding portion 31 includes a plurality of recess portions 31a1 each recessed in the direction parallel to the top surface 301a of the substrate 301 at an end of the protruding portion 31 in the U direction. In the example shown in FIG. 11, each of the plurality of recess portions 31a1 is recessed in the −U direction. The second portion 312 includes the plurality of recess portions 31a1.

Herein, a portion located between two adjoining recess portions 31a1 is referred to as a protruding portion 31a2. As shown in FIG. 11, the protruding portion 31 includes a plurality of protruding portions 31a2. Each of the protruding portions 31a2 is shaped to protrude in the direction parallel to the top surface 301a of the substrate 301. In the example shown in FIG. 11, each of the plurality of protruding portions 31a2 protrudes in the U direction. The end portion 31a of the protruding portion 31 includes the plurality of recess portions 31a1 and the plurality of protruding portions 31a2. As the recess portions 31a1 and the protruding portions 31a2 are alternately arranged, the end portion 31a has a periodic saw-tooth shape when seen in the Z direction.

As shown in FIG. 12, each recess portion 31a1 includes two sidewalls SW1 and SW2 facing each other. A distance D1 between the two sidewalls SW1 and SW2 may become larger in the U direction (in the direction away from the first portion 311). In other words, the dimension of the recess portion 31a1 in the direction parallel to the V direction may become larger in the U direction (in the direction away from the first portion 311).

Though not shown, the recess portion 31a1 may further include two other sidewalls facing each other. The distance between the two other sidewalls may be constant irrespective of the distance from the first portion 311. The two other sidewalls may be located respectively forward of the two sidewalls SW1 and SW2 in the U direction.

Note that each protruding portion 31a2 substantially includes the sidewall SW1 of one of the two adjoining recess portions 31a1 and the sidewall SW2 of the other of the two adjoining recess portions 31a1. A distance D2 between the sidewall SW1 and the sidewall SW2 becomes smaller in the U direction (in the direction away from the first portion 311). In other words, the dimension of the protruding portion 31a2 in the direction parallel to the V direction becomes smaller in the U direction (in the direction away from the first portion 311).

As shown in FIG. 11, the plurality of recess portions 31a1 are arranged in a direction intersecting with the U direction. In particular, in the example shown in FIG. 11, the plurality of recess portions 31a1 are arranged in the V direction orthogonal to the U direction. The plurality of recess portions 31a1 include two specific recess portions 31a1 located at opposite ends in the direction parallel to the V direction. In the example shown in FIG. 11, each of the two specific recess portions 31a1 includes the two sidewalls SW1 and SW2 shown in FIG. 12.

Herein, a given value of the distance D1 shown in FIG. 12 is defined as the width of the recess portion 31a1. A given value of the distance D2 shown in FIG. 12 is defined as the distance between the two adjoining recess portions 31a1. For example, the mean value of the distance D1 may be defined as the width of the recess portion 31a1, and the mean value of the distance D2 may be defined as the distance between the two adjoining recess portions 31a1. Alternatively, the distances D1 and D2 in the VZ cross section intersecting with the center of the recess portion 31a1 in the direction parallel to the U direction may be respectively defined as the width of the recess portion 31a1 and the distance between the two adjoining recess portions 31a1. In the example embodiment, the distance between the two adjoining recess portions 31a1 is larger than the width of each recess portion 31a1. Note that the distance between the two adjoining recess portions 31a1 is substantially the same as the width of each protruding portion 31a2. Thus, in the example embodiment, the width of each protruding portion 31a2 is larger than the width of each recess portion 31a1.

Note that FIG. 8 shows an example in which the respective end portions 31a of the plurality of protruding portions 31 are arranged in the V direction, to facilitate understanding. In other words, the plurality of end portions 31a are arranged at the same position in the direction parallel to the U direction. However, the plurality of end portions 31a need not be arranged in the V direction.

Figure 13:
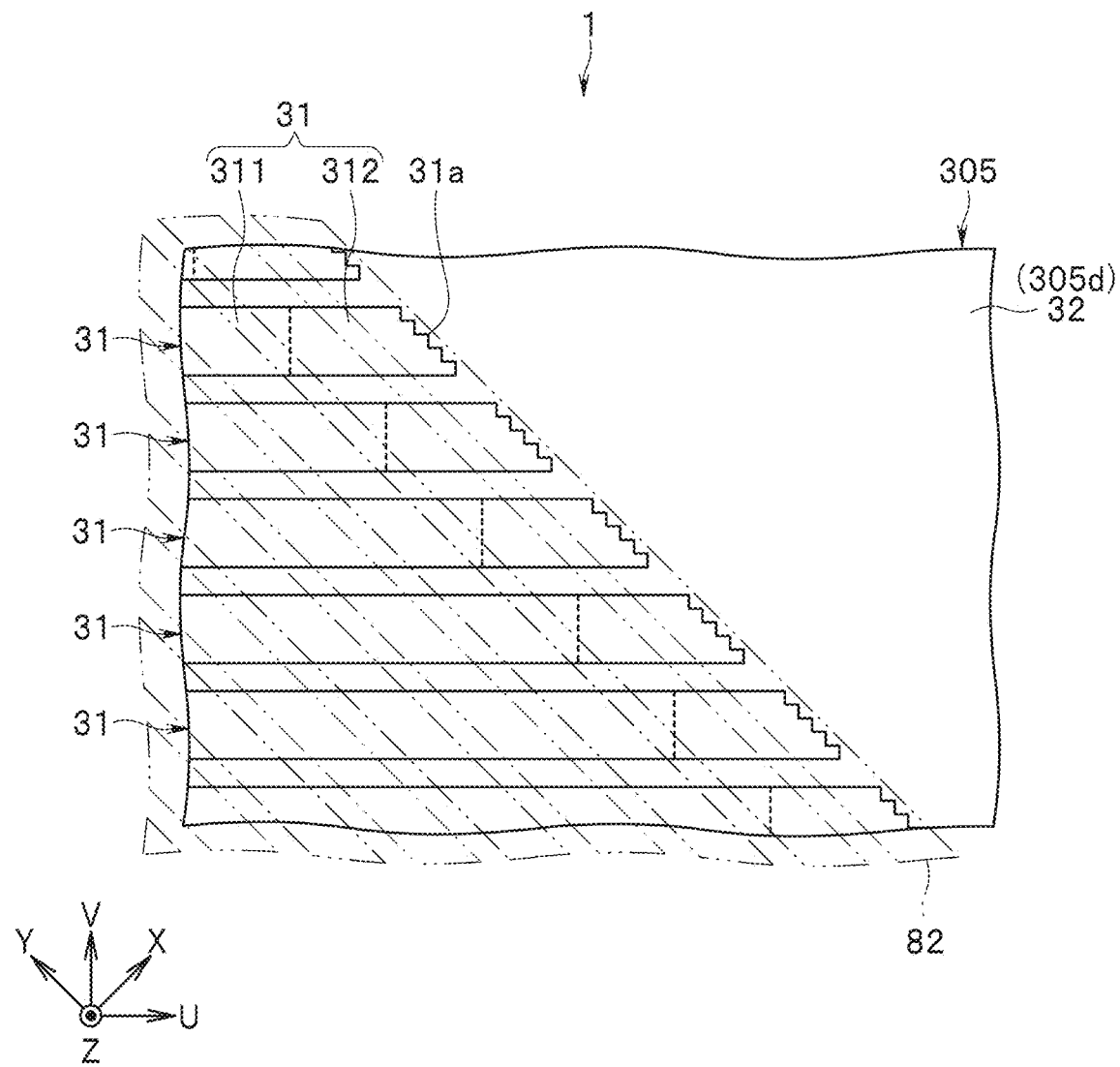
FIG. 13 is a plan view showing a first modification example of an arrangement of respective end portions of a plurality of protruding portions of the first example embodiment of the technology.

Hereinafter, with reference to FIGS. 13 and 14, description will be made on a first modification example and a second modification example in which the plurality of end portions 31a are not arranged in the V direction. FIG. 13 is a plan view showing the first modification example of an arrangement of the plurality of end portions 31a. In the first modification example, the plurality of end portions 31a are arranged in the Y direction. In other words, the plurality of end portions 31a are arranged at the same position in a direction parallel to the X direction.

Note that in the first modification example, the plurality of recess portions 31a1 of each of the plurality of protruding portions 31 may be arranged in the direction orthogonal to the U direction, or may be arranged in a direction intersecting with the U direction at an angle other than 90°. In the example shown in FIG. 13, the plurality of recess portions 31a1 are arranged in the Y direction.

As described above, the plurality of upper coil elements 82 extend in the direction parallel to the Y direction. In the first modification example, the plurality of upper coil elements 82 may include an upper coil element 82 disposed on the plurality of end portions 31a or the plurality of second portions 312.

Figure 14:
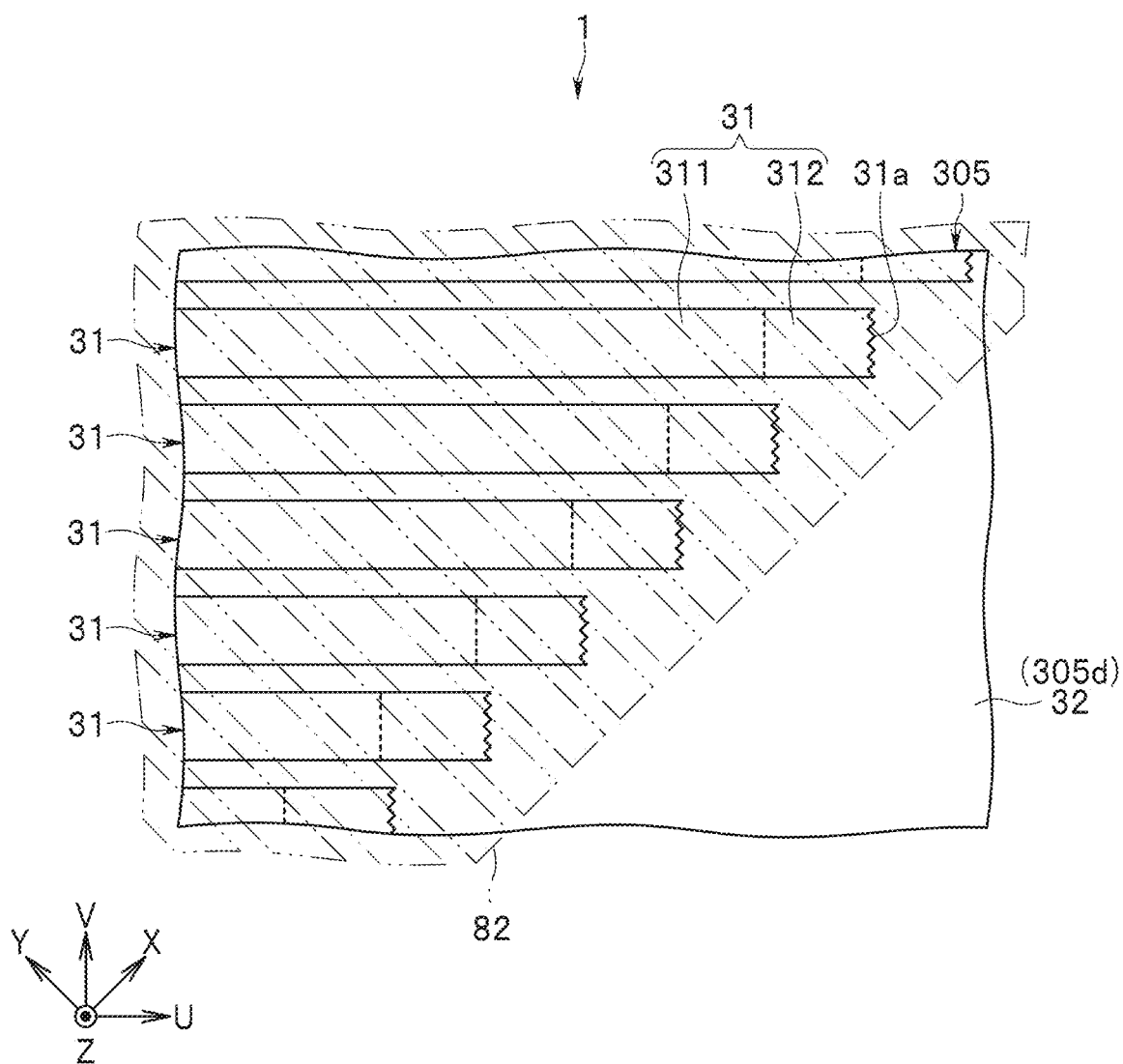
FIG. 14 is a plan view showing a second modification example of an arrangement of respective end portions of a plurality of protruding portions of the first example embodiment of the technology.

FIG. 14 is a plan view showing the second modification example of the arrangement of the plurality of end portions 31a. In the second modification example, the plurality of end portions 31a are arranged in the X direction. In other words, the plurality of end portions 31a are arranged at the same position in the direction parallel to the Y direction.

Note that in the second modification example, the plurality of recess portions 31a1 of each of the plurality of protruding portions 31 may be arranged in the direction orthogonal to the U direction, or may be arranged in a direction intersecting with the U direction at an angle other than 90° as in the first modification example. In the example shown in FIG. 14, the plurality of recess portions 31a1 are arranged in the V direction.

In the second modification example, the plurality of upper coil elements 82 may include an upper coil element disposed on one end portion 31a or one second portion 312, or may include an upper coil element disposed on two or more end portions 31a or two or more second portions 312. The plurality of upper coil elements 82 may be respectively electrically connected to the plurality of lower coil elements 81 at positions located forward of the respective end portions 31a of the plurality of protruding portions 31 in the −Y direction.

The description has been made heretofore of the shape of the end portion 31a of each protruding portion 31. The end portion 31b of each protruding portion 31 has a shape similar to the shape of the end portion 31a. In other words, the protruding portion 31 includes a plurality of recess portions each recessed in the direction parallel to the top surface 301a of the substrate 301 at an end of the protruding portion 31 in the −U direction. The third portion 313 includes the foregoing plurality of recess portions. The end portion 31b of each protruding portion 31 includes the foregoing plurality of recess portions, and a plurality of protruding portions each located between two adjoining recess portions of the foregoing plurality of recess portions. As the recess portions and the protruding portions are alternately arranged, the end portion 31b has a periodic saw-tooth shape when seen in the Z direction.

The end portion 31a of each protruding portion 31 and the end portion 31b of each protruding portion 31 may have shapes symmetrical about the VZ plane intersecting with the center of the protruding portion 31 in the longitudinal direction. In such a case, each of the foregoing plurality of recess portions is recessed in the U direction.

The description of the shapes of the plurality of recess portions 31a1 basically holds true for the plurality of recess portions constituting the end portion 31b of each protruding portion 31. In addition, the description of the arrangement of the plurality of end portions 31a basically holds true for the plurality of end portions 31b.

Next, operations and effects of the magnetic sensor 1 according to the example embodiment will be described. In the example embodiment, the first and second MR elements 50B and 50C, the lower electrodes 61B and 61C, and the upper electrodes 62B and 62C (hereinafter referred to as the MR elements 50 etc.) are formed on the protruding portions 31 of the insulating layer 305. The MR elements 50 etc., are formed by etching films to be etched using photolithography. Therefore, in the process of manufacturing the magnetic sensor 1, a photoresist mask having a predetermined flat shape is formed on the protruding portions 31.

Herein, a case is considered where a photoresist mask is formed near the end portions 31a of the protruding portions 31. In a case where each end portion 31a has a smooth shape, photoresist for forming the photoresist mask will flow out of the end portion 31a, with the result that the photoresist mask cannot be formed with high accuracy.

In contrast, in the example embodiment, each protruding portion 31 includes the plurality of recess portions 31a1 constituting the end portion 31a. According to the example embodiment, as the end portion 31a of each protruding portion 31 has a shape including protrusions and recesses, the flowout of photoresist from the end portion 31a can be suppressed, and thus, a photoresist mask can be formed with high accuracy. Consequently, according to the example embodiment, the accuracy of the shapes of the MR elements 50 etc., formed near the end portions 31a of the protruding portions 31 can be increased.

Similarly, in the example embodiment, each protruding portion 31 includes a plurality of recess portions constituting the end portion 31b. According to the example embodiment, the accuracy of the shapes of the MR elements 50 etc., formed near the end portions 31b of the protruding portions 31 can be increased for the same reason as the above.

In the example embodiment, the dimension of the second portion 312 in the Z direction becomes smaller in the direction away from the first portion 311. In particular, in the example embodiment, the dimension of the second portion 312 in the Z direction is less than or equal to the dimension of the first portion 311 in the Z direction. In other words, in the example embodiment, the protruding portion 31 does not bulge in a region from the first portion 311 to the second portion 312. Thereby according to the example embodiment, the accuracy of the shape of the MR element 50 etc., formed near the boundary between the first portion 311 and the second portion 312 can be increased. Further, according to the example embodiment, the loss of the shape of the upper coil element 82 formed near the boundary between the first portion 311 and the second portion 312 can be suppressed.

Similarly, in the example embodiment, the dimension of the third portion 313 in the Z direction becomes smaller in the direction away from the first portion 311. In particular, in the example embodiment, the dimension of the third portion 313 in the Z direction is less than or equal to the dimension of the first portion 311 in the Z direction. According to the example embodiment, the accuracy of the shape of the MR element 50 etc., formed near the boundary between the first portion 311 and the third portion 313 can be increased, and the loss of the shape of the upper coil element 82 formed near the boundary between the first portion 311 and the third portion 313 can be suppressed for the same reason as the above.

Next, other effects of the example embodiment will be described. In the example embodiment, the dimension of the protruding surface 305c in the direction parallel to the Z direction is preferably in the range from 1.4 μm or more to 3.0 μm or less. According to the example embodiment, setting the dimension of the protruding surface 305c to greater than or equal to 1.4 μm can increase the inclination of each of the first inclined surface 305a and the second inclined surface 305b and thus can enhance the sensitivity of the magnetic sensor 1 to a component of the target magnetic field in the direction parallel to the Z direction. Consequently, according to the example embodiment, the second detection value Sz can be generated with high accuracy. In addition, according to the example embodiment, setting the dimension of the protruding surface 305c to less than or equal to 3.0 µm can form a photoresist mask including a photoresist layer with high accuracy on the first inclined surface 305a and the second inclined surface 305b during the process of manufacturing the magnetic sensor 1.

Modification Example

Figure 15:
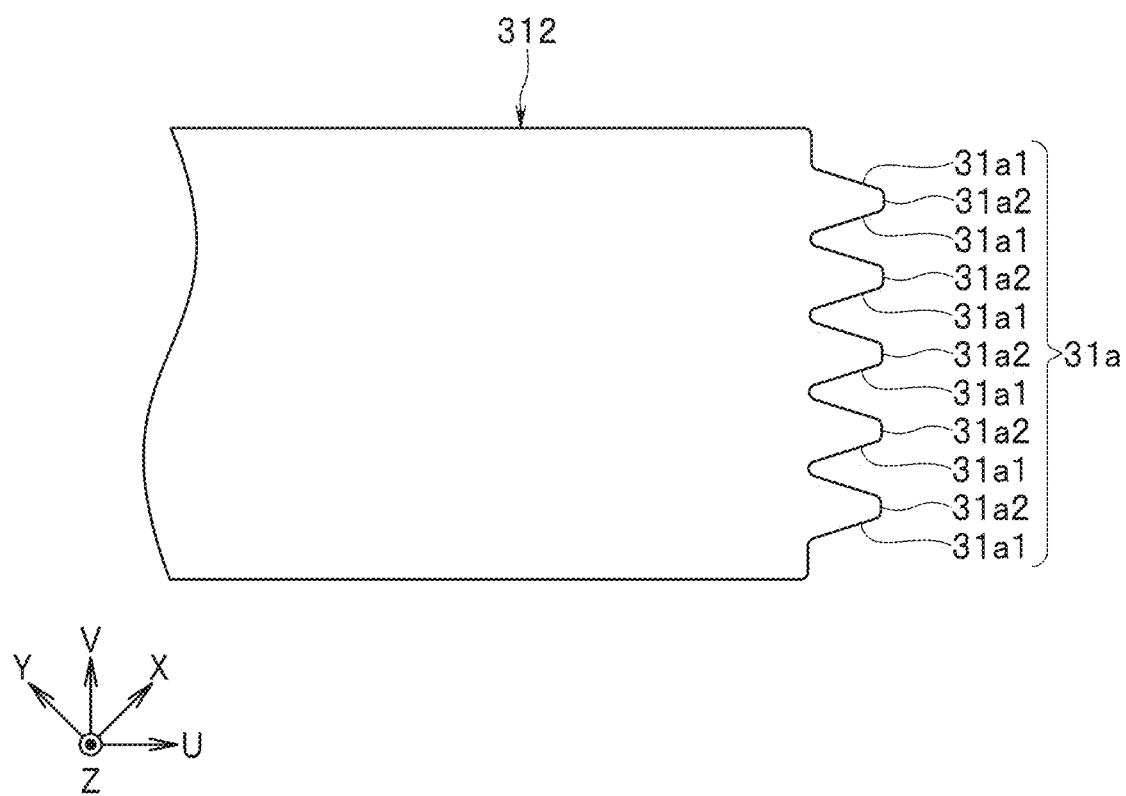
FIG. 15 is a plan view showing a modification example of an end portion of the protruding portion of the first example embodiment of the technology.

Next, a modification example of the end portion 31a of each protruding portion 31 will be described with reference to FIG. 15. FIG. 15 is a plan view showing a modification example of the end portion 31a. In the modification example, the plurality of recess portions 31a1 include two specific recess portions 31a1 located at opposite ends in the direction parallel to the V direction. Each of the plurality of recess portions 31a1 other than the two specific recess portions 31a1 includes the two sidewalls SW1 and SW2 described with reference to FIG. 12. Meanwhile, each of the two specific recess portions 31a1 includes only one sidewall corresponding to the sidewall SW1 or the sidewall SW2.

Second Example Embodiment

Figure 16:
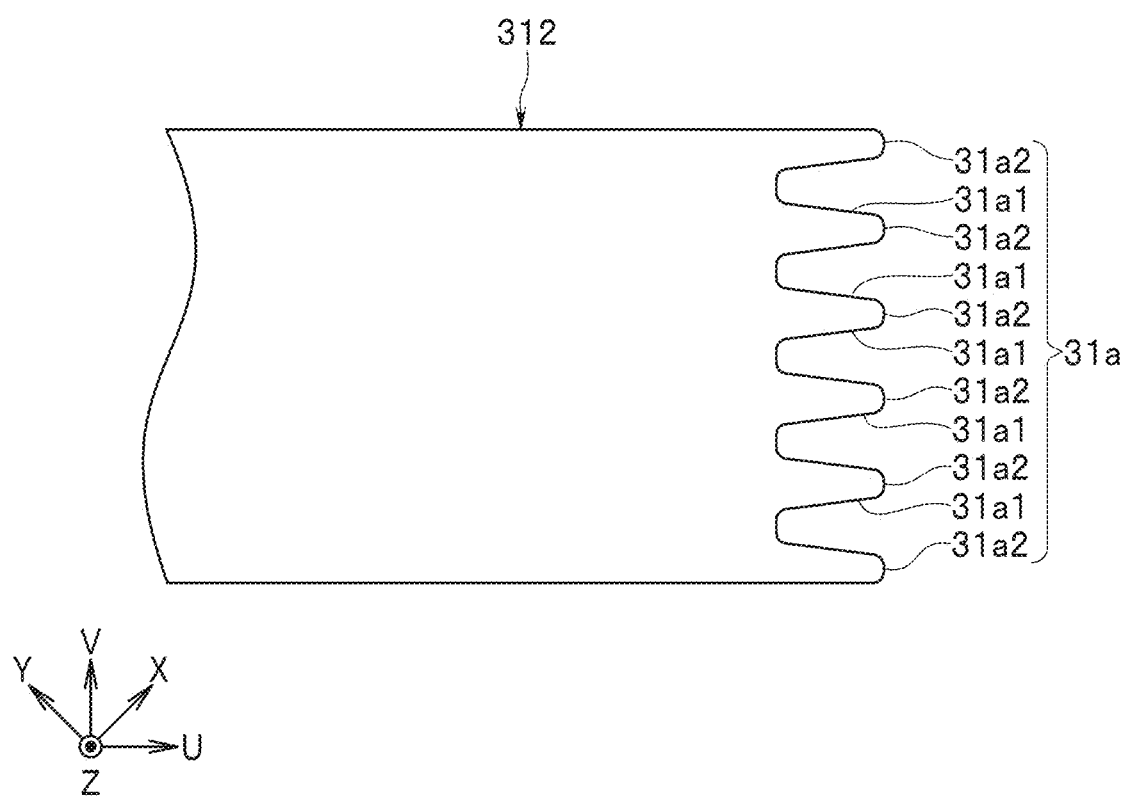
FIG. 16 is a plan view showing a plurality of recess portions of a second example embodiment of the technology.

Next, a second example embodiment of the technology will be described with reference to FIG. 16. FIG. 16 is a plan view showing a plurality of recess portions of the example embodiment.

In the example embodiment, the distance between the two adjoining recess portions 31a1 (for example, the mean value of the distance D2 shown in FIG. 12) is smaller than or equal to the width of each recess portion 31a1 (for example, the mean value of the distance D1 shown in FIG. 12). In the example shown in FIG. 16, the distance between the two adjoining recess portions 31a1 is smaller than the width of each recess portion 31a1. In other words, in the example embodiment, the width of each protruding portion 31a2 is smaller than the width of each recess portion 31a1.

Other configurations, operations, and effects of the example embodiment are similar to those of the first example embodiment.

The technology is not limited to the foregoing example embodiments, and various modifications may be made thereto. For example, the magnetic detection elements are not limited to MR elements, and may be other elements such as Hall elements that detect a magnetic field.

The magnetic sensor 1 may further include a third detection circuit configured to detect a component of the target magnetic field in a direction parallel to the XY plane, and generate at least one third detection signal having a correspondence with the component. In such a case, the processor 40 may be configured to generate a detection value corresponding to a component of the target magnetic field in the direction parallel to the U direction based on the at least one third detection signal. The third detection circuit may be integrated with the first and second detection circuits 20 and 30, or may be included in a chip separate from the first and second detection circuits 20 and 30.

Each sensor element of the technology is not limited to a magnetic detection element, and may be a sensor element configured to change in a physical property depending on a predetermined physical quantity. The predetermined physical quantity may be the quantity of the state of any physical phenomenon that can be detected by the sensor element, such as not only a magnetic field but also an electric field, temperature, displacement, and force. The foregoing description of the example embodiment holds true for, other than a magnetic sensor, a sensor including sensor elements other than magnetic detection elements if the magnetic detection elements are replaced with the sensor elements. In such a case, the functional layers may be a portion that constitutes at least a part of each sensor element and changes in a physical property depending on a predetermined physical quantity. In such a case, the metal layer may be any wiring layer.

As described above, the sensor according to one embodiment of the technology is a sensor configured to detect a predetermined physical quantity. The sensor according to one embodiment of the technology includes a substrate including a top surface, a support member disposed on the substrate, and sensor elements each configured to change in a physical property depending on a predetermined physical quantity. The support member includes a flat portion including a flat surface parallel to the top surface of the substrate, and at least one protruding portion shaped to protrude from the flat surface. The at least one protruding portion includes an inclined surface inclined with respect to the top surface of the substrate. Each sensor element includes functional layers constituting at least a part of the sensor element. The functional layers are disposed on the inclined surface. The at least one protruding portion extends in a first direction parallel to the top surface of the substrate, and includes a plurality of recess portions each recessed in a direction parallel to the top surface of the substrate at an end of the at least one protruding portion in the first direction.

In the sensor according to one embodiment of the technology, the at least one protruding portion includes a first portion, and a second portion located at a position forward of the first portion in the first direction and including a plurality of recess portions. The dimension of the second portion in a second direction perpendicular to the top surface of the substrate may become smaller in a direction away from the first portion. The dimension of the second portion in the second direction may be less than or equal to the dimension of the first portion in the second direction. The functional layers may be disposed on the first portion.

In the sensor according to one embodiment of the technology, at least some recess portions of the plurality of recess portions may include two sidewalls facing each other. The distance between the two sidewalls may become larger in the first direction. The plurality of recess portions may be arranged in a third direction parallel to the top surface of the substrate and intersecting with the first direction, and may include two specific recess portions located at opposite ends in a direction parallel to the third direction. Each of the two specific recess portions may include two sidewalls. The distance between two adjoining recess portions of the plurality of recess portions may be larger than or smaller than the width of each of the plurality of recess portions.

In the sensor according to one embodiment of the technology, the plurality of recess portions may be arranged in a direction parallel to the top surface of the substrate and orthogonal to the first direction. Alternatively, the plurality of recess portions may be arranged in a direction parallel to the top surface of the substrate and intersecting with the first direction at an angle other than 90°.

In the sensor according to one embodiment of the technology, the at least one protruding portion may include a plurality of protruding portions.

In the sensor according to one embodiment of the technology, the predetermined physical quantity may be at least one of the direction or strength of an external magnetic field. The sensor elements may be magnetic detection elements each configured to detect a change in at least one of the direction or strength of the external magnetic field. Each magnetic detection element may be a magnetoresistive element. The functional layers may include a plurality of magnetic films. The magnetoresistive element may further include a nonmagnetic metal layer disposed between the inclined surface and the plurality of magnetic films.

Obviously, various modification examples and variations of the technology are possible in the light of the above teachings. Thus, it is to be understood that, within the scope of the appended claims and equivalents thereof, the technology may be practiced in other embodiments than the foregoing example embodiments.

What is claimed is:

1. A sensor configured to detect a physical quantity, comprising:
   a substrate including a top surface;
   a support member disposed on the substrate; and
   a sensor element configured to change in a physical property depending on the physical quantity, wherein
   the support member includes a flat portion including a flat surface parallel to the top surface of the substrate, and a protruding portion shaped to protrude from the flat surface,
   the protruding portion includes an inclined surface inclined with respect to the top surface of the substrate,
   the sensor element includes a functional layer constituting at least a part of the sensor element,
   the functional layer is disposed on the inclined surface,
   the protruding portion extends in a first direction parallel to the top surface of the substrate, and includes a first end portion located at an end of the protruding portion in the first direction,
      the protruding portion includes a first portion, and a second portion located at a position forward of the first portion in the first direction and including the first end portion, and
   a dimension of the second portion in a second direction perpendicular to the top surface of the substrate becomes smaller in a direction away from the first portion.

2. The sensor according to claim 1, wherein a dimension of the first portion in the second direction is constant.

3. The sensor according to claim 1, wherein the dimension of the second portion in the second direction is less than or equal to a dimension of the first portion in the second direction.

4. The sensor according to claim 1, wherein the first end portion when seen in the second direction has a shape including protrusions and recesses.

5. The sensor according to claim 4, wherein the first end portion when seen in the second direction has a shape including a periodic saw-tooth shape.

6. The sensor according to claim 1, wherein
   the protruding portion further includes a second end portion located at an end of the protruding portion in a direction opposite to the first direction,
   the protruding portion further includes a third portion located at a position forward of the first portion in the direction opposite to the first direction and including the second end portion, and
   a dimension of the third portion in the second direction becomes smaller in a direction away from the first portion.

7. The sensor according to claim 6, wherein the dimension of the third portion in the second direction is less than or equal to a dimension of the first portion in the second direction.

8. The sensor according to claim 6, wherein the second end portion when seen in the second direction has a shape including protrusions and recesses.

9. The sensor according to claim 8, wherein the second end portion when seen in the second direction has a shape including a periodic saw-tooth shape.

10. The sensor according to claim 1, wherein the functional layer is disposed on the first portion.

11. The sensor according to claim 1, wherein
    the physical quantity is at least one of a direction or a strength of an external magnetic field, and
    the sensor element is a magnetic detection element configured to detect a change in at least one of the direction or the strength of the external magnetic field.

12. The sensor according to claim 11, wherein
    the magnetic detection element is a magnetoresistive element, and
    the functional layer includes a plurality of magnetic films.

13. The sensor according to claim 12, wherein the magnetoresistive element further includes a nonmagnetic metal layer disposed between the inclined surface and the plurality of magnetic films.

14. A sensor configured to detect a physical quantity, comprising:
    a substrate;
    a support member disposed on a surface of the substrate, the support member including a flat portion having a flat surface parallel to the substrate, and a protruding portion formed to protrude from the flat surface and arranged to extend in a first direction parallel to the substrate,
    the protruding portion including,
       an inclined surface inclined with respect to the substrate,
       a first portion, and
       a second portion located at a position forward of the first portion in the first direction, wherein a height of the second portion relative to the substrate decreases as the distance from the first portion increases; and
    a sensor element configured to detect the physical quantity, at least a part of the sensor element being disposed on the inclined surface.

15. The sensor according to claim 14, wherein
    the second portion includes a first end portion located at an end of the protruding portion in the first direction, the first end portion being formed in a shape that is not straight when seen in a direction perpendicular to the substrate.

* * * * *